(12) United States Patent
Jacob et al.

(10) Patent No.: US 9,312,387 B2
(45) Date of Patent: Apr. 12, 2016

(54) METHODS OF FORMING FINFET DEVICES WITH ALTERNATIVE CHANNEL MATERIALS

(71) Applicant: GLOBALFOUNDRIES Inc., Grand Cayman (KY)

(72) Inventors: Ajey Poovannummoottil Jacob, Albany, NY (US); Murat Kerem Akarvardar, Saratoga Springs, NY (US); Michael Hargrove, Clinton Corners, NY (US); Ruilong Xie, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 131 days.

(21) Appl. No.: 14/069,955

(22) Filed: Nov. 1, 2013

(65) Prior Publication Data

US 2015/0123166 A1    May 7, 2015

(51) Int. Cl.
*H01L 29/78*    (2006.01)
*H01L 29/66*    (2006.01)
*H01L 27/092*    (2006.01)
*H01L 21/8238*  (2006.01)

(52) U.S. Cl.
CPC ...... *H01L 29/785* (2013.01); *H01L 21/823807* (2013.01); *H01L 21/823821* (2013.01); *H01L 27/0924* (2013.01); *H01L 29/66795* (2013.01)

(58) Field of Classification Search
CPC ............ H01L 29/66795; H01L 29/785; H01L 27/0886; H01L 21/823431; H01L 21/823821; H01L 27/0924; H01L 27/1211
USPC .......... 257/288, 401, 347; 438/283, 586, 595, 438/151, 157, 199, 197
See application file for complete search history.

(56) References Cited

U.S. PATENT DOCUMENTS

| 8,264,032 B2* | 9/2012 | Yeh et al. ........................ 257/327 |
| 2006/0170066 A1* | 8/2006 | Mathew et al. ................ 257/401 |
| 2015/0091099 A1* | 4/2015 | Ching et al. ................... 257/401 |

* cited by examiner

*Primary Examiner* — David Vu
*Assistant Examiner* — Jonathan Han
(74) *Attorney, Agent, or Firm* — Amerson Law Firm, PLLC

(57) ABSTRACT

Disclosed are methods and devices that involve formation of alternating layers of different semiconductor materials in the channel region of FinFET devices. The methods and devices disclosed herein involve forming a doped silicon substrate fin and thereafter forming a layer of silicon/germanium around the substrate fin. The methods and devices also include forming a gate structure around the layer of silicon/germanium using gate first or gate last techniques.

20 Claims, 15 Drawing Sheets

METHODS OF FORMING FINFET DEVICES WITH ALTERNATIVE CHANNEL MATERIALS

BACKGROUND OF THE INVENTION

1. Field of the Invention

Generally, the present disclosure relates to the manufacture of semiconductor devices, and, more specifically, to various methods of forming FinFET devices with alternative channel materials.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A conventional FET is a planar device that typically includes a source region, a drain region, and a channel region that is positioned between the source region and the drain region, and a gate electrode positioned above the channel region. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the past decades. More specifically, the channel length of FETs has been significantly decreased, which has resulted in improving the switching speed and in lowering operation currents and voltages of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a planar FET, there are so-called 3D devices, such as an illustrative FinFET device, which is a three-dimensional structure. FIG. 1A is a perspective view of an illustrative prior art FinFET semiconductor device "A" that is formed above a semiconductor substrate B. The device A includes three illustrative fins C, a gate structure D, sidewall spacers E and a gate cap layer F. The gate structure D is typically comprised of a layer of insulating material (not separately shown), e.g., a layer of high-k insulating material, and one or more conductive material layers that serve as the gate electrode for the device A. The fins C have a three-dimensional configuration: a height H, a width W and an axial length L. The axial length L corresponds to the direction of current travel in the device A when it is operational. The portions of the fins C covered by the gate structure D are the channel regions of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source/drain regions.

In the FinFET device A, the gate structure D encloses both sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance capability and reliability of such devices. Device designers are currently investigating using alternative semiconductor materials, such as so-called III-V materials, to manufacture FinFET devices, which are intended to enhance the performance capabilities of such devices, e.g., to enable low-voltage operation.

However, the integration of such alternative materials on silicon substrates (the dominant substrates used in the industry) is a non-trivial matter due to, among other issues, the large difference in lattice constants between such alternative materials and silicon. That is, in the case where an alternative fin material (not shown in FIG. 1A) is formed on a fin C defined in the substrate B, i.e., a substrate fin C, the lattice constant of the alternative fin material may be greater than the lattice constant of the substrate fin C. As a result of this mismatch in lattice constants, an unacceptable number of defects may be formed or created in the alternative fin material portion.

One process that has been investigated for use in forming such alternative fin materials is known as aspect-ratio-trapping (ART). In general, the ART process involves forming a masking layer, such as silicon dioxide, above a semiconductor substrate, such as silicon, patterning the masking layer to define a trench that exposes the underlying substrate, and performing an epitaxial growth process to form an alternative fin material, e.g., silicon/germanium, on the exposed substrate, wherein the growth is confined within the trench. That is, the ART process involves epitaxially growing fully relaxed, unstrained material hetero-structures in a high aspect-ratio silicon dioxide trench having an aspect ratio of 5 or greater in an effort to decrease defects. In some applications, the ART process may involve the formation of trenches that have a very high aspect ratio, e.g., about 25-30. Importantly, in the ART process, the trench is made deep enough such that defects generated in the alternative fin material will be trapped at or near the bottom of the original trench and in the sidewalls of the trench positioned slightly above the interface between the substrate material and the alternative fin material. The amount of defects generated and the propagation of such defects will depend upon the crystal orientation of the substrate. The intent of the ART process is that, while the defect-containing fin material is present at or near the bottom of the trench, the uppermost portions of the epitaxially grown alternative fin material will be substantially defect-free material but, importantly, it is an unstrained material. That is, the alternative fin material is fully relaxed in all crystalline planes, e.g., in the crystalline planes that correspond to the axial length direction, height direction and width direction of the fin. This occurs due to the "trapping" of the defects at or near the bottom of the trench, with the result being the formation of substantially defect-free alternative fin material above the defective-containing portions of the alternative fin material in the lower portion of the trench. The ART process reduces the thickness of the material requirement for non-defective growth in comparison to the blanket growth of a similar structure. However, in the ART growth process, there are intentionally-formed defects present in the bottom portion of the alternative fin material as well as defects at the interface of the hetero-structure, and the grown material is typically relatively thick, e.g., about 200-300 nm, which corresponds to the fin height direction. The defects are generated along the <111> crystallographic direction of the alternative fin material and they are captured or stopped by the sidewalls of the trench.

Another prior art process that has been employed to form alternative fin materials on silicon substrate fins is simplistically depicted in FIGS. 1B-1E. FIG. 1B depicts the prior art device 10 after several process operations were performed. First, an etching process, such as a dry or wet etching process, was performed on the substrate 12 through a patterned hard mask layer (not shown) to form a plurality of trenches 14 in the substrate 12. This etching process results in the definition of a plurality of substrate fins 16. Then, as shown in FIG. 1C, a layer 18 of alternative semiconductor material, e.g., silicon/germanium, is formed on the substrate fins 16 and within the trenches 14 by performing an epitaxial deposition process. Then, as shown in FIG. 1D, a layer of insulating material 22, e.g., silicon dioxide, is formed in the trenches 14 of the device such that it overfills the trenches 14. Next, as shown in FIG. 1E, an etching process, such as a dry, wet or vapor phase etching process, was performed to reduce the thickness of the layer of insulating material 22, a process that essentially defines the final fin height of the fins. At the point depicted in FIG. 1E, a gate structure, either a permanent gate structure or a sacrificial gate structure (neither of which is shown) would be formed on the fins using traditional techniques.

Another prior art process that has been employed to form alternative fin materials on silicon substrate fins is simplistically depicted in FIGS. 2A-2D. FIG. 2A depicts the prior art device 10 after several process operations were performed. First, an etching process, such as a dry or wet etching process, was performed on the substrate 12 through a patterned hard mask layer (not shown) to form a plurality of trenches 14 in the substrate 12. As before, this etching process results in the definition of a plurality of substrate fins 16. Then, as shown in FIG. 2B, the above-described layer of insulating material 22, e.g., silicon dioxide, was formed in the trenches 14 of the device such that it overfills the trenches 14. Next, as shown in FIG. 2C, an etching process, such as a dry, wet or vapor phase etching process, was performed to reduce the thickness of the layer of insulating material 22, a process that essentially defines the final fin height of the fins. Then, as shown in FIG. 2D, the above-described layer 18 of alternative semiconductor material, e.g., silicon/germanium, was formed on the exposed portions of the substrate fins 16 by performing an epitaxial deposition process. At the point depicted in FIG. 2D, a gate structure, either a permanent gate structure or a sacrificial gate structure (neither of which is shown) would be formed on the fins using traditional techniques.

The present disclosure is directed to methods of forming FinFET devices with alternative channel materials that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to methods of forming FinFET devices with alternative channel materials. One illustrative method disclosed herein involves forming a doped fin for the device, wherein the doped fin includes a doped region that extends at least throughout a vertical height and a lateral width of the doped fin and at least into a portion of the substrate positioned vertically under the doped fin, forming a layer of silicon/germanium ($Si_xGe_{1-x}$) around at least a portion of the doped fin, and forming a gate structure around at least a portion of the layer of a silicon/germanium.

Another illustrative method disclosed herein involves forming a doped fin for the device, wherein the doped fin includes a doped region that extends at least throughout a vertical height and a lateral width of the doped fin and at least into a portion of the substrate positioned vertically under the doped fin and wherein the doped region has a dopant concentration of at least $1-3\times10^{18}$ ions/cm$^3$ of a P-type dopant or an N-type dopant, forming a layer of germanium or silicon/germanium ($Si_xGe_{1-x}$) on and in contact with at least a portion of the doped fin, and forming a gate structure around at least a portion of the layer of silicon/germanium.

Yet another illustrative method involves forming a doped fin for the device, wherein the doped fin includes a doped region that extends at least throughout a vertical height and a lateral width of the doped fin and at least into a portion of the substrate positioned vertically under the doped fin and wherein the doped region has a dopant concentration of at least $1-3\times10^{18}$ ions/cm$^3$ of a P-type dopant or an N-type dopant, forming a diffusion blocking layer on and in contact with at least a portion of the doped fin, forming a layer of germanium or silicon/germanium ($Si_xGe_{1-x}$) on and in contact with the diffusion blocking layer, and forming a gate structure around at least a portion of the layer of silicon/germanium.

Another illustrative method disclosed herein includes forming a doped fin for the device, wherein the doped fin includes a doped region that extends at least throughout a vertical height and a lateral width of the doped fin and at least into a portion of the substrate positioned vertically under the doped fin, forming a first diffusion blocking layer on and in contact with at least a portion of the doped fin, forming a layer of germanium or silicon/germanium ($Si_xGe_{1-x}$) on and in contact with the first diffusion blocking layer, forming a second diffusion blocking layer on and in contact with at least a portion of the layer of silicon/germanium, forming a layer of an alternative semiconductor material on and in contact with the second diffusion blocking layer, wherein the alternative semiconductor material is comprised of one of silicon/germanium, silicon/carbon, a III-V material, a II-VI materials, InP, InAs, GaAs, InGaAs, InSb, InGaSb, or combinations thereof, and forming a gate structure around at least a portion of the layer of alternative semiconductor material.

One illustrative device disclosed herein includes a fin comprised of silicon, a doped region that extends at least throughout a vertical height and a lateral width of the fin and at least into a portion of the substrate that is positioned vertically under the fin, a layer of silicon/germanium ($Si_xGe_{1-x}$) positioned around at least a portion of the fin and a gate structure positioned around at least a portion of the layer of silicon/germanium.

Yet another illustrative device disclosed herein includes a fin comprised of silicon, a doped region that extends at least throughout a vertical height and a lateral width of the fin and at least into a portion of the substrate that is positioned vertically under the fin, a first diffusion blocking layer positioned on and in contact with at least a portion of the fin, a layer of germanium or silicon/germanium ($Si_xGe_{1-x}$) positioned on and in contact with the first diffusion blocking layer, a second diffusion blocking layer positioned on and in contact with at least a portion of the layer of silicon/germanium, a layer of an alternative semiconductor material positioned on and in contact with the second diffusion blocking layer, wherein the alternative semiconductor material is comprised of one of silicon/germanium, silicon/carbon, a III-V material, a II-VI materials, InP, InAs, GaAs, InGaAs, InSb, InGaSb, or combinations thereof, and a gate structure positioned around at least a portion of the layer of alternative semiconductor material.

BRIEF DESCRIPTION OF THE DRAWINGS

The disclosure may be understood by reference to the following description taken in conjunction with the accompanying drawings, in which like reference numerals identify like elements, and in which.

Figure 1A:
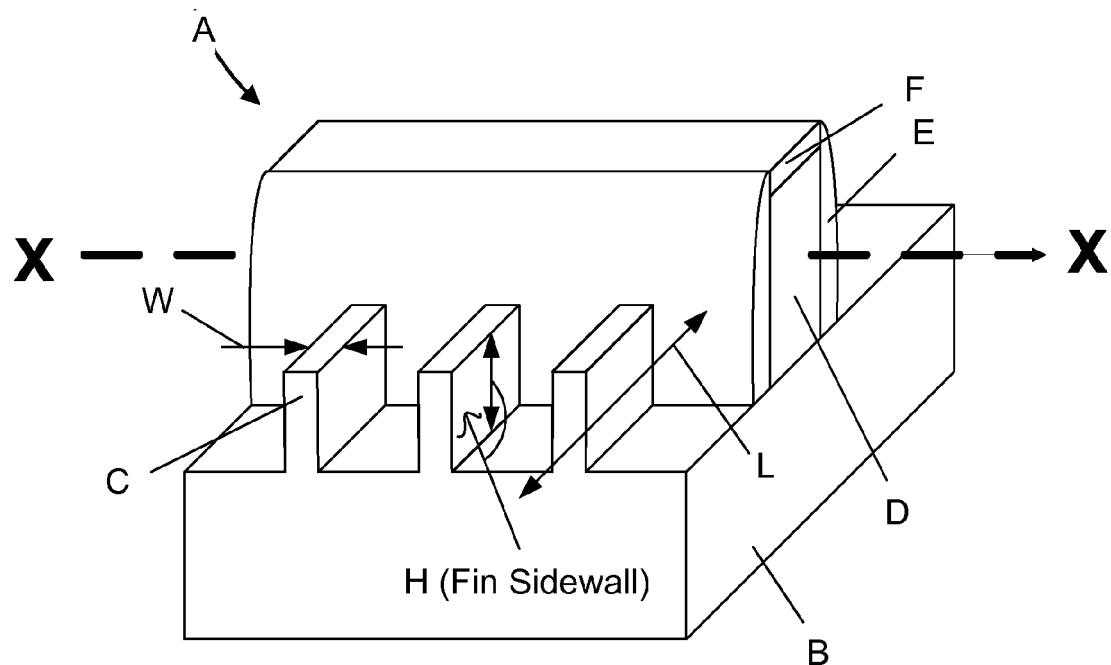
FIGS. 1A-1E depict one illustrative prior art method of forming alternative fin materials on substrate fins.
Figure 1B:
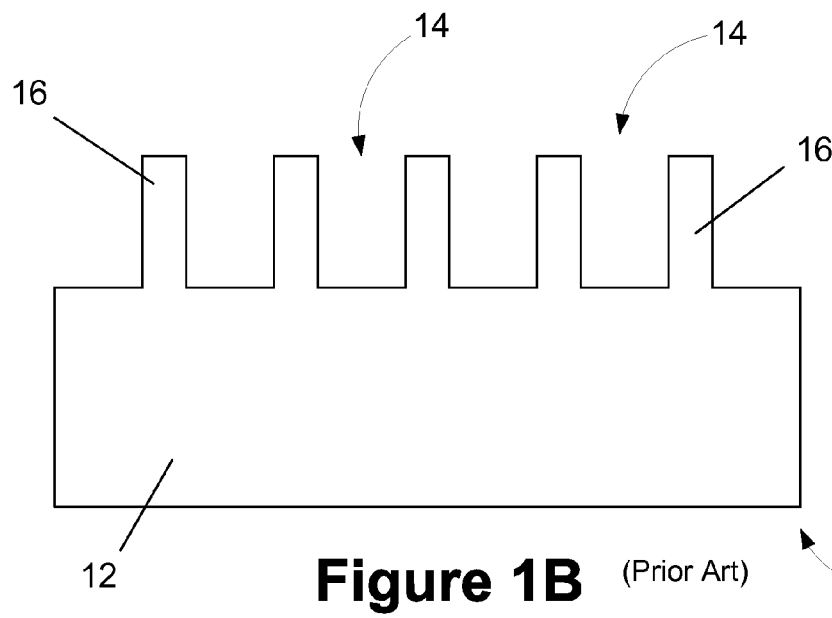
Figure 1C:
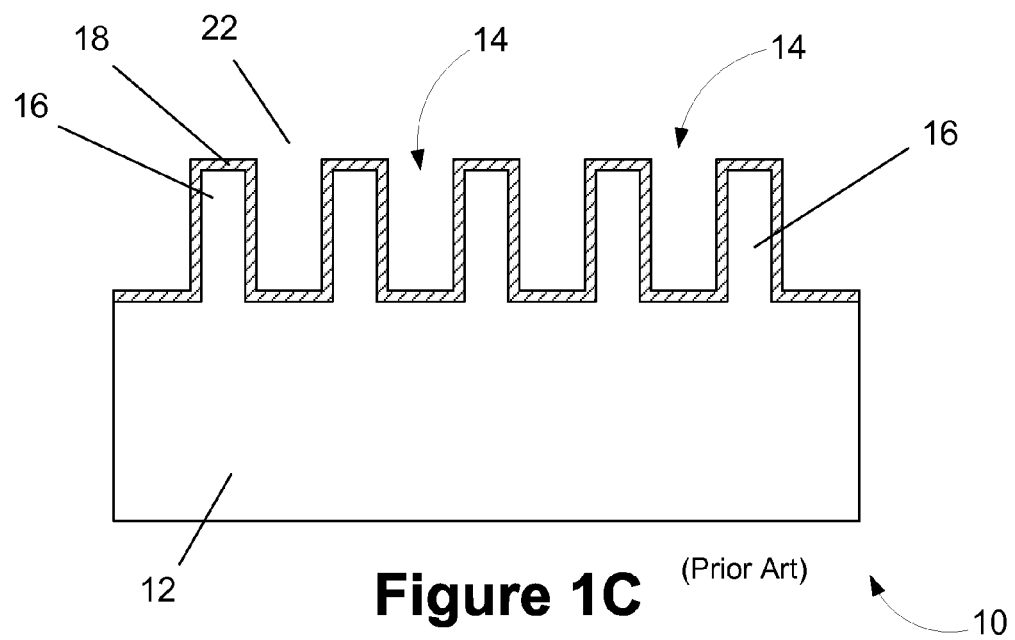
Figure 1D:
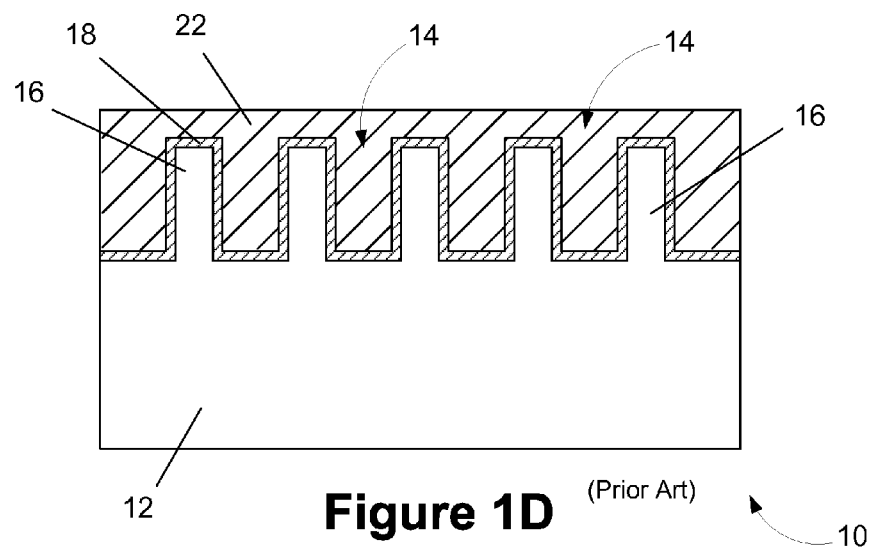
Figure 1E:
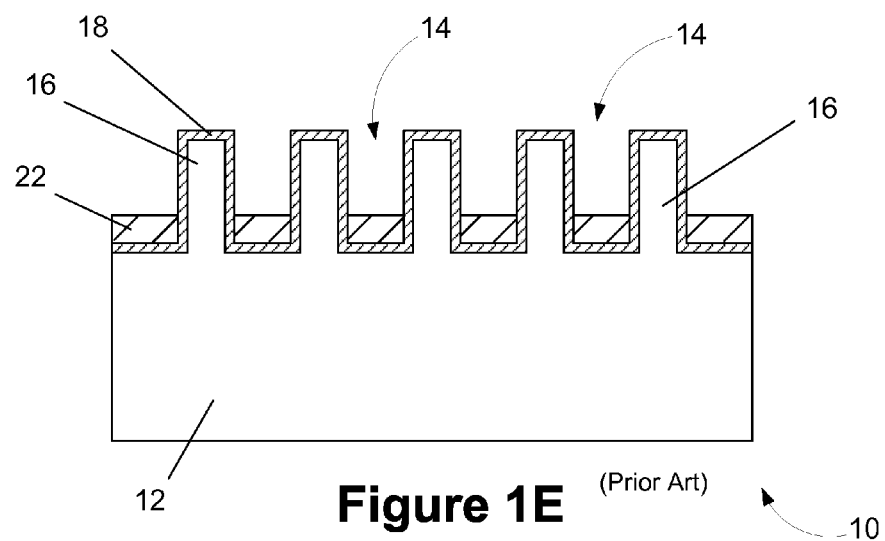
Figure 2A:
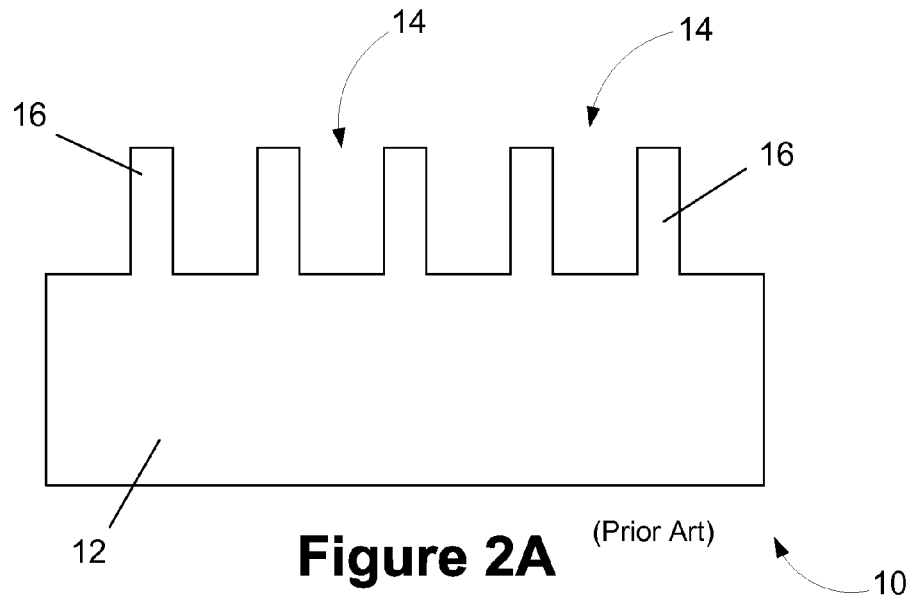
FIGS. 2A-2D depict another illustrative prior art method of forming alternative fin materials on substrate fins.
Figure 2B:
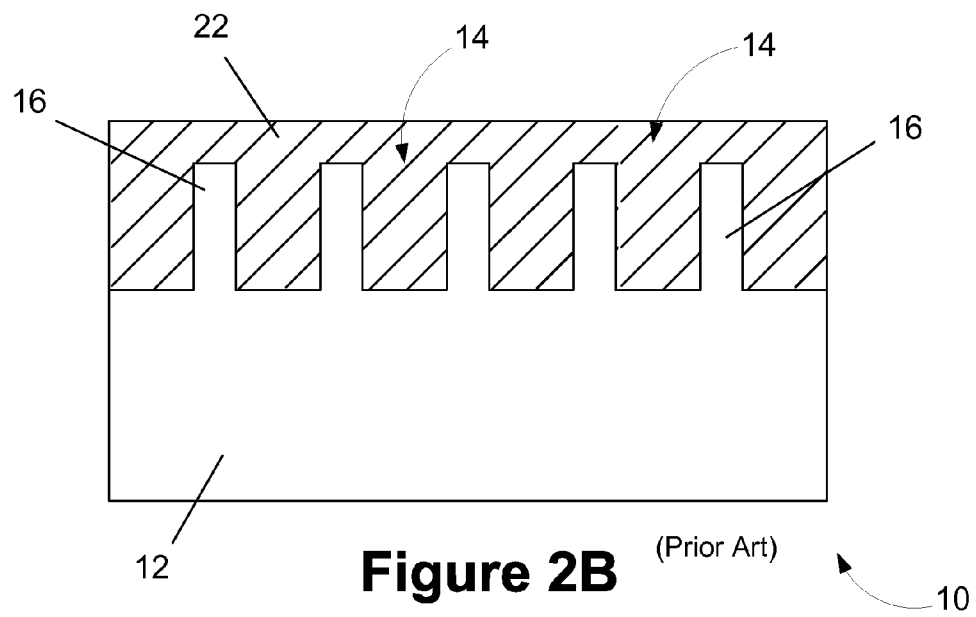
Figure 2C:
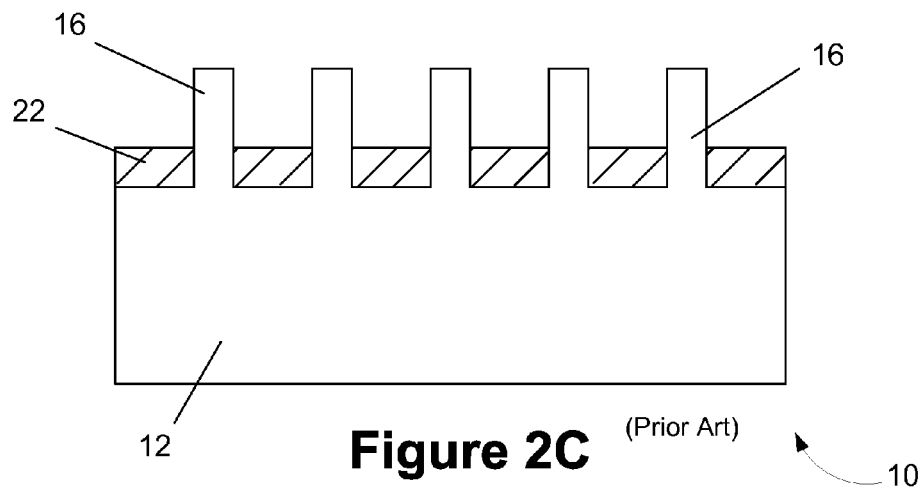
Figure 2D:
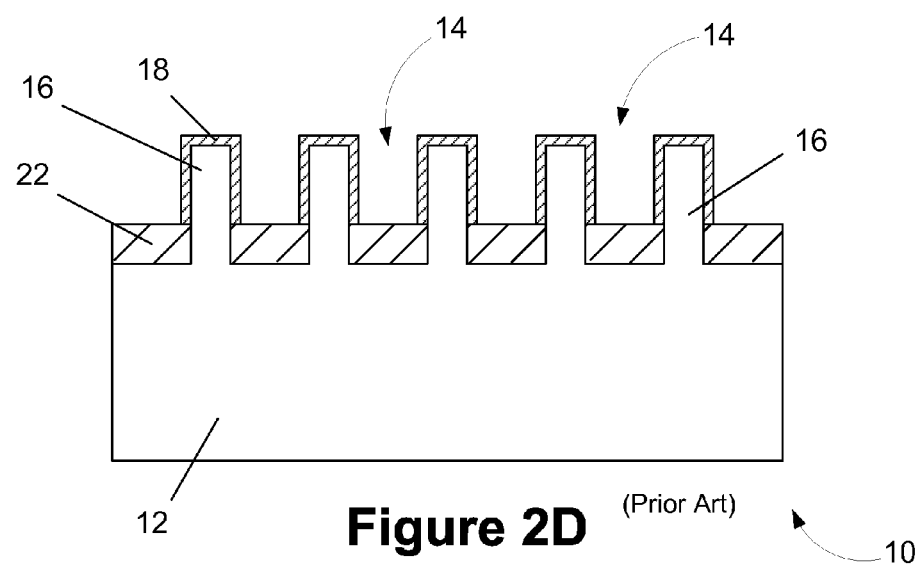

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming FinFET devices with alternative channel materials and the resulting device structures. The method disclosed herein may be employed in manufacturing either an N-type device or a P-type device, and the gate structure of such devices may be formed using either so-called "gate-first" or "replacement gate" ("gate-last") techniques. As will be readily apparent to those skilled in the art upon a complete reading of the present application, the inventions disclosed herein are applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

The devices disclosed herein may be formed using a variety of techniques. FIGS. 3A-3I depict one illustrative method disclosed herein for forming FinFET devices comprised of alternative semiconductor materials. With reference to FIG.

3A, the devices disclosed herein will be depicted as being formed above an illustrative semiconductor substrate 102 comprised of a first semiconductor material, such as, for example, silicon, etc. The illustrative substrate 102 may be a bulk semiconductor substrate or it may be the active layer of a so-called SOI (silicon-on-insulator) substrate. Thus, the terms "substrate," "semiconductor substrate" or "semiconducting substrate" should be understood to cover all semiconductor materials and all forms of such semiconductor materials.

In general, the methods disclosed herein involve, among other things, initially introducing dopant materials into the fins and the substrate of a FinFET device 100. In one case, the dopants may be introduced into the substrate 102 before the fins are formed, while in another case, the dopants may be introduced into the fins and the substrate 102 after the fins are formed.

Figure 3A:
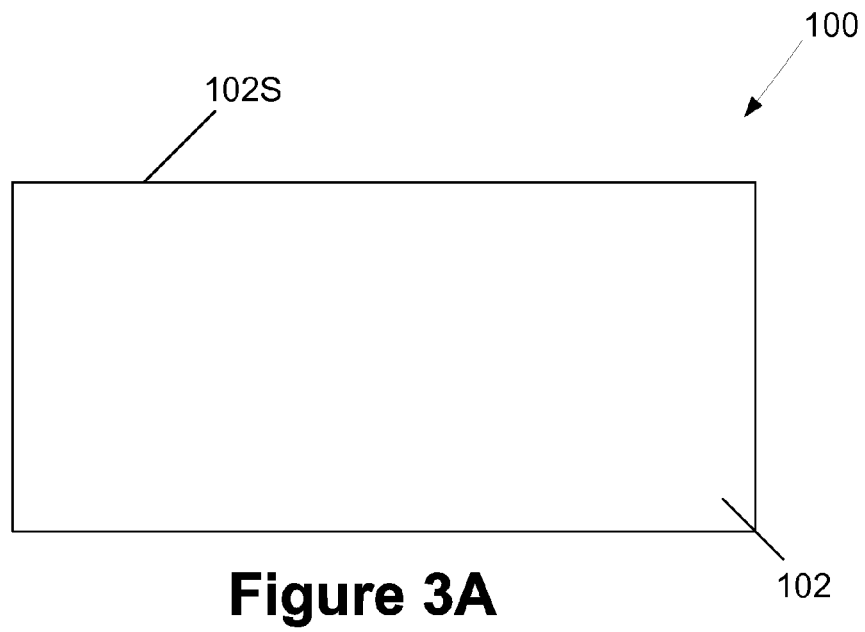
FIGS. 3A-3I depict one illustrative method disclosed herein for forming FinFET devices comprised of alternative semiconductor materials.
Figure 3B:
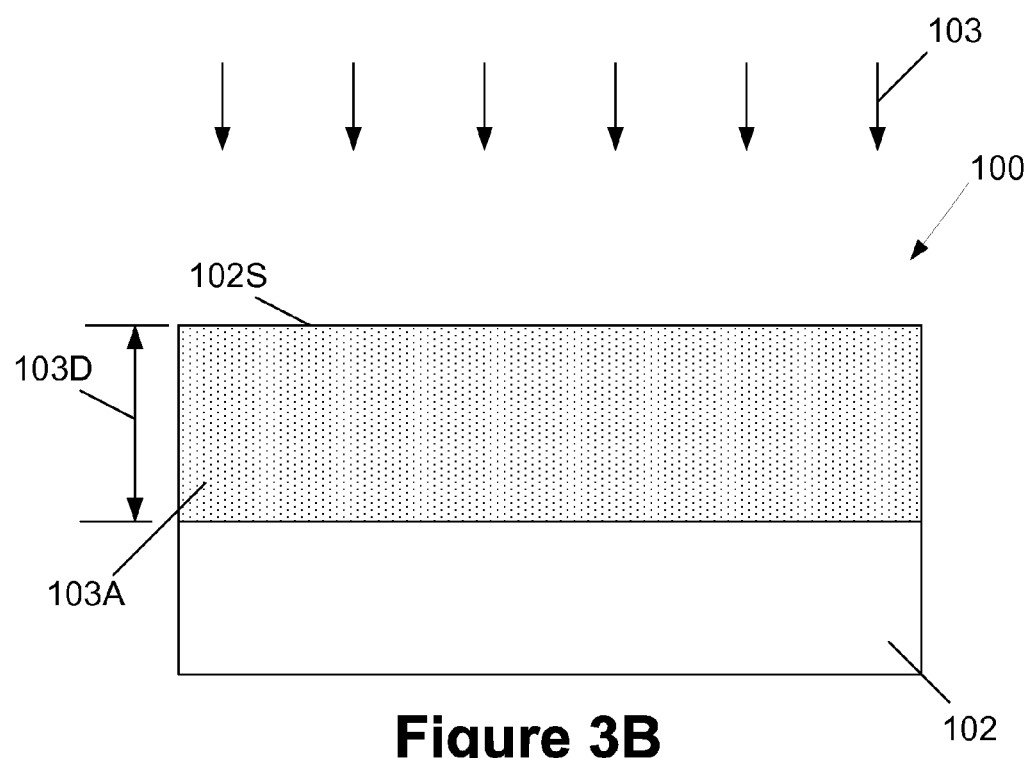
Figure 3C:
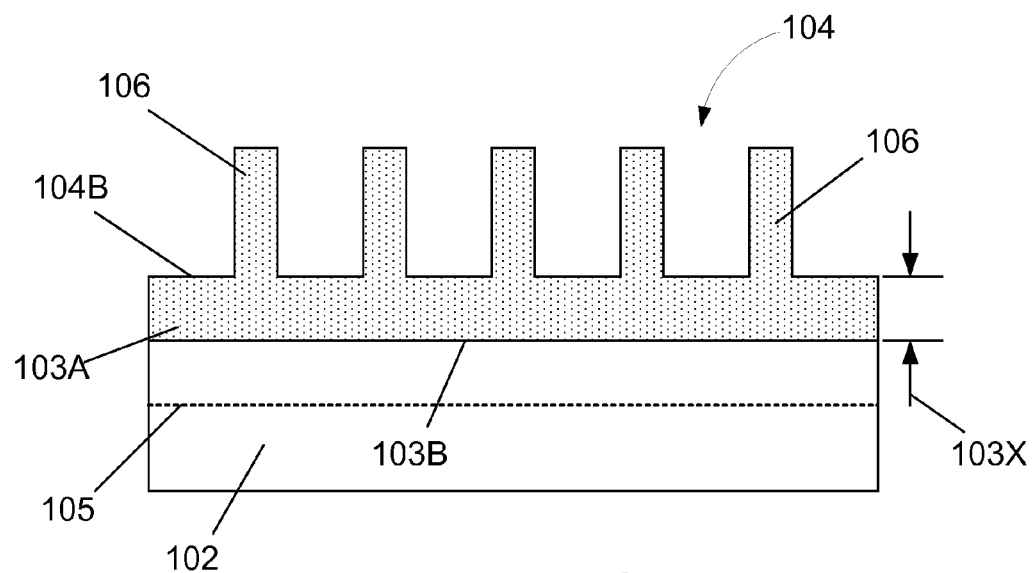

In the sequence depicted in FIGS. 3A-3C, the dopant materials are introduced into the substrate 102 prior to the formation of the fins for the FinFET device 100. Accordingly, FIG. 3A depicts the substrate 102 prior to introduction of the dopant materials introduced as described herein. Of course, at least portions of the substrate 102 may be doped with various materials prior to beginning the doping processes described herein. For example, the substrate 102 may be supplied from the substrate manufacturer in a condition where at least an upper portion and the front surface 102S of the substrate 102 may be doped with a P-type dopant or an N-type dopant.

As shown in FIG. 3B, an ion implantation process 103 is performed to form a doped region 103A in the substrate 102. During the process, an N-type dopant or a P-type dopant material is introduced into the substrate 102, depending upon the type of FinFET device 100 being fabricated. More specifically, for an N-type FinFET device 100, a P-type dopant, such as boron or boron difluoride, will be used as the dopant material. Conversely, for a P-type FinFET device 100, an N-type dopant, such as arsenic or phosphorous, will be used as the dopant material. Thus, as used herein and in the attached claims, when it is stated that a "dopant material" (or similar phrase) is introduced into the substrate 102 and/or fins for the FinFET device 100, is should be understood to mean that the "dopant material" is an N-type dopant material or a P-type dopant material. The dopant dose and implant energy used in the ion implantation process 103 may vary depending upon the particular application. In one particular example, the dopant dose for the implant process 103 is selected such that, after the device 100 is completed, the current flow through the channel region of the FinFET device 100 will be substantially confined to the alternative fin material that will be formed on the doped fins, as described more fully below. In one illustrative example, the ion implantation process 103 may be performed using a dopant dose that falls within the range of $1 \times 10^{13}$-$1 \times 10^{15}$ ions/cm$^2$ and at an energy level that falls within the range of about 1-5 keV. As noted above, the dopant type will depend upon the type of FinFET device 100 under construction. In this embodiment, the overall depth 103D of the doped region 103A will also vary depending upon the particular application, e.g., the overall depth 103 may fall within the range of about 30-80 nm. Of course, as with any ion implantation process, there will be a distribution of the implanted ions. In general, the resulting doped region 103A will have a dopant concentration of at least 1-3×10$^{18}$ ions/cm$^3$. In one example, the doped region 103A may have a dopant concentration of at least about 1×10$^{19}$ ion/cm$^3$. In the example depicted in FIG. 3A, the target depth for the location of peak dopant concentration will be about 40 nm. The implantation process 103 may be performed before or after the formation of any isolation structures (not shown) in the substrate 102. Of course, appropriate masking layers (not shown) may be formed above the substrate 102 to implant different type dopant materials during separate ion implantation processes 103.

FIG. 3C depicts the FinFET device 100 after several process operations were performed. First a patterned etch mask (not shown) was formed above the substrate 102. Then, an etching process, such as a dry or wet etching process, was performed on the substrate 102 through the patterned etch mask to form a plurality of trenches 104 in the substrate 102. This etching process results in the definition of a plurality of substrate fins 106. The patterned etch mask is intended to be representative in nature as it may be comprised of a variety of different materials and take a variety of different forms. For example, such a patterned etch mask may be comprised of, silicon nitride, silicon oxynitride, hafnium oxide, etc., and it may be comprised of multiple layers of material. For example, the patterned etch mask layer may be comprised of a layer of silicon dioxide, e.g., a pad oxide layer, and a layer of silicon nitride, e.g., a pad nitride layer, that were formed above the substrate 102 by performing known deposition techniques, e.g., chemical vapor deposition (CVD) processes, atomic layer deposition (ALD) processes, etc. The patterned etch mask may be patterned using known sidewall image transfer techniques and/or photolithographic techniques combined with performing known etching techniques. In some applications, a further etching process may be performed to reduce the width or to "thin" the substrate fins 106, although such a thinning process is not depicted in the attached drawings. For purposes of this disclosure and the claims, the use of the terms "fin" or "fins" should be understood to refer to fins that have not been thinned as well as fins that have been subjected to such a thinning etch process.

With continuing reference to FIG. 3C, the overall size, shape and configuration of the trenches 104 and substrate fins 106 may vary depending on the particular application. The depth and width of the trenches 104 may vary depending upon the particular application. In one illustrative embodiment, based on current day technology, the depth of the trenches 104 may range from approximately 40-100 nm and the width of the trenches 104 may be about 20-300 nm. In some embodiments, the substrate fins 106 may have a final width (at or near the bottom of the fin) within the range of about 15-20 nm. In the illustrative examples depicted in the attached figures, the trenches 104 and substrate fins 106 are all of a uniform size and shape. However, such uniformity in the size and shape of the trenches 104 and the substrate fins 106 is not required to practice at least some aspects of the inventions disclosed herein. In the example depicted herein, the trenches 104 are formed by performing an anisotropic etching process that results in the trenches 104 having a schematically depicted, generally rectangular configuration. In an actual real-world device, the sidewalls of the trenches 104 may be somewhat inwardly tapered, although that configuration is not depicted in the drawings. In some cases, the trenches 104 may have a reentrant profile near the bottom of the trenches 104. To the extent the trenches 104 are formed by performing a wet etching process, the trenches 104 may tend to have a more rounded configuration or non-linear configuration as compared to the generally rectangular configuration of the trenches 104 that are formed by performing an anisotropic etching process. Thus, the size and configuration of the trenches 104 and the substrate fins 106, and the manner in which they are made, should not be considered a limitation of the present invention. For ease of disclosure, only the substantially rectangular trenches 104 and substrate fins 106 will be depicted in subsequent drawings. As noted in FIG. 3C, the implant process 103 is designed such that the bottom 103B of the implant region 103A is positioned a distance 103X below the bottom 104B of the trenches 104. In one illustrative embodiment, the distance 103X may fall within the range of about 10-50 nm. Of course, other doped regions may also have been formed in the substrate by this point in the process, or they may be formed later. For example, the dashed line 105 indicates the location of a bottom surface of a previously formed doped well region for the FinFET device 100. The concentration of dopant material in the well region and the depth of the well region will vary depending upon the particular application. The well region will be doped with P-type or N-type dopant materials, for an N-type and P-type FinFET device 100, respectively.

Figure 3D:
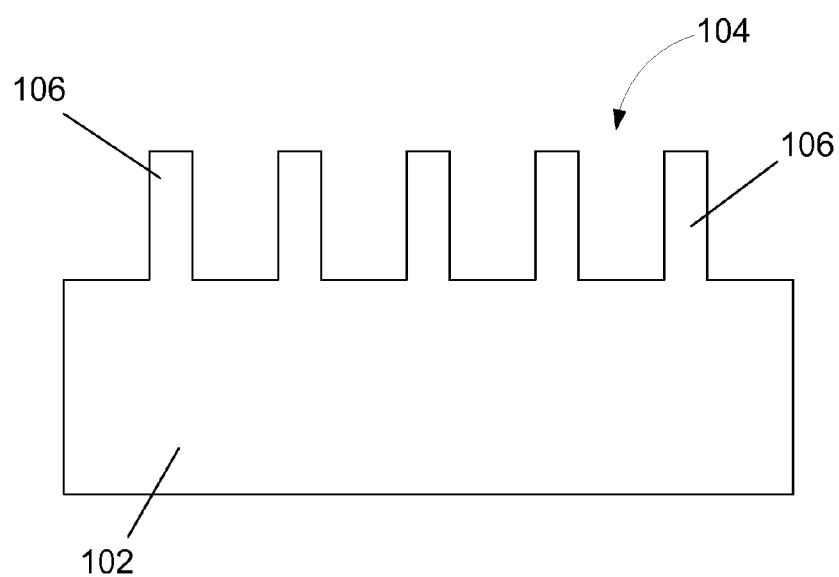
Figure 3E:
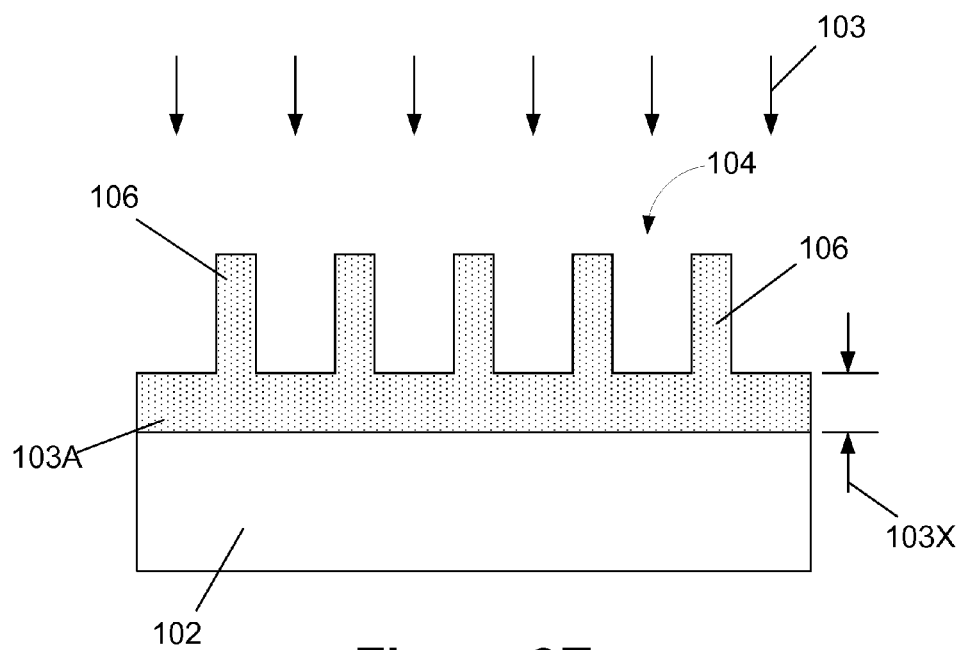

In the sequence depicted in FIGS. 3D-3E, the dopant materials are introduced into the substrate 102 after formation of the substrate fins 106 for the FinFET device 100. Accordingly, this process flow begins with obtaining the substrate 102 depicted in FIG. 3A. Thereafter, as shown in FIG. 3D, an etching process, such as a dry or wet etching process, was performed on the substrate 102 through the patterned etch mask to form the above-described plurality of trenches 104 in the substrate 102. As before, this etching process results in the definition of the above-described plurality of substrate fins 106. FIG. 3E depicts the FinFET device 100 after the above-described ion implantation process 103 was performed to form a doped region 103A in the substrate 102 and the substrate fins 106. Thus, the structure depicted in FIGS. 3C and 3E may be achieved by performing at least two different process flows. The structure depicted in FIGS. 3C and 3E may then be subjected to further processing as described below. The fin with the doped region 103A formed therein may sometimes be referred to as a doped fin elsewhere in this specification and in the attached claims.

Figure 3F:
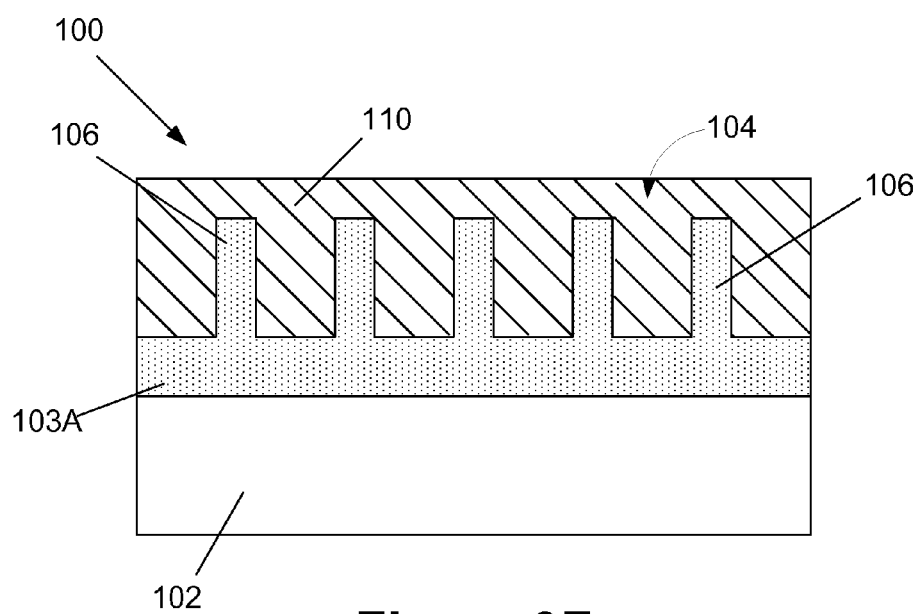

FIG. 3F depicts the FinFET device 100 after a layer of insulating material 110 was formed in the trenches 104 of the device such that it overfills the trenches 104. The layer of insulating material 110 may be comprised of a variety of different materials, such as silicon dioxide, etc., and it may be formed by performing a variety of techniques, e.g., CVD, spincoating, etc. In one illustrative embodiment, the layer of insulating material 110 may be a layer of silicon dioxide or a flowable oxide material that is formed by performing a CVD process. In the example depicted in FIG. 3F, the as deposited surface of the layer of insulating material 110 may be positioned slightly above the upper surface of the patterned etch mask (not shown) that typically is still in position at this point in the process flow.

Figure 3G:
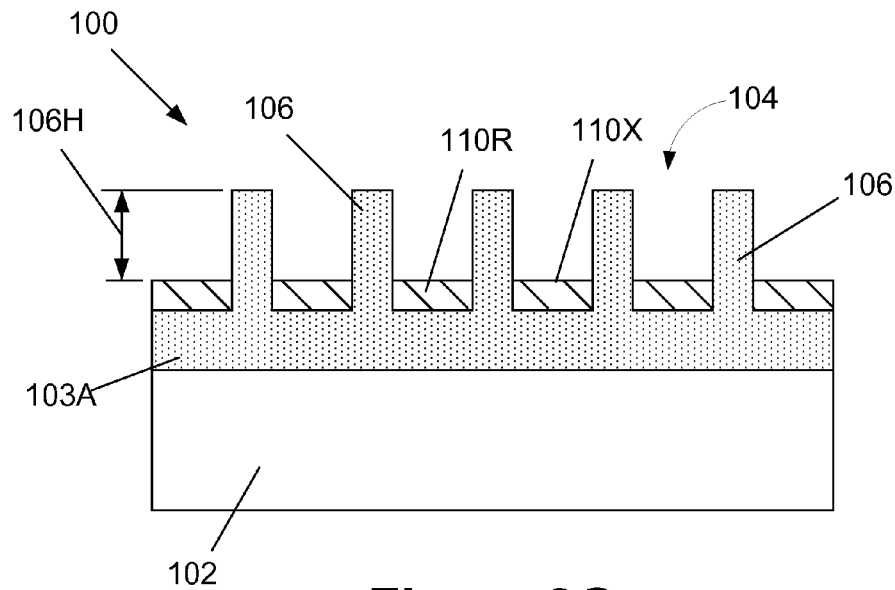

FIG. 3G depicts the FinFET device 100 after several process operations were performed. Typically, one or more chemical mechanical polishing (CMP) processes are performed to planarize the surface of the layer of insulating material 110 using the patterned etch mask (not shown) to stop the CMP process. After such a CMP process, the upper surface of the layer of insulating material 110 is substantially level with the upper surface of the patterned etch mask. Then, an etching process is typically performed on the layer of insulating material 110 to reduce its thickness and thereby result in a recessed layer of insulating material 110R having a recessed upper surface 110X. The recessed surface 110X of the recessed layer of insulating material 110R essentially defines the final active fin height 106H of the fins 106 disclosed herein. The final active fin height 106H may vary depending upon the particular application and, in one illustrative embodiment, may range from about 30-60 nm.

Figure 3H:
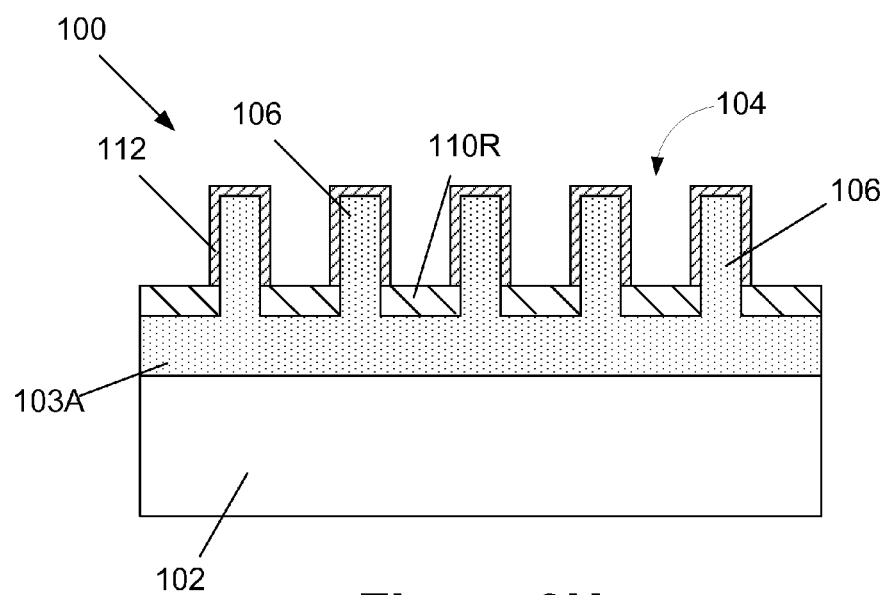

FIG. 3H depicts the device 100 after a layer 112 of an alternative semiconductor material that is different than the semiconductor material of the substrate fins 106 is formed around the upper surface and the sidewall surfaces of the substrate fins 106. In one illustrative embodiment, the layer 112 of alternative semiconductor material may be comprised of germanium, silicon/germanium ($Si_xGe_{1-x}$) or a III-V semiconductor material that is formed by performing an epitaxial growth process, and it may be either doped (in situ) or undoped. In one illustrative embodiment, the layer 112 of alternative semiconductor material may be a fully-strained layer of silicon/germanium ($SiGe_{0.5}$) having a thickness of about 3-6 nm. In some cases, if desired, a diffusion blocking layer (not shown in FIG. 3H) may be formed on the upper surface and the sidewall surfaces of the substrate fins 106 prior to the formation of the layer 112 of alternative semiconductor material. The purpose of such a diffusion blocking layer, if employed, is to prevent or limit out-diffusion of the dopant materials in the substrate fin 106 when the layer 112 of alternative semiconductor material is being formed. If employed, such a diffusion blocking layer may be comprised of a relatively thin (e.g., 1-3 nm thick) layer of materials, e.g., silicon/carbon, silicon/germanium/carbon, a fluorine-containing silicon, etc., that is formed by performing an epitaxial growth process that may or may not involve in situ doping. In one particular embodiment, the sidewalls of the fin 106 are positioned in or near the [100] of the substrate 102. Such positioning can be achieved by using a (100) substrate 102 rotated 45 degrees or by using a (110) substrate that is not rotated.

Figure 3I:
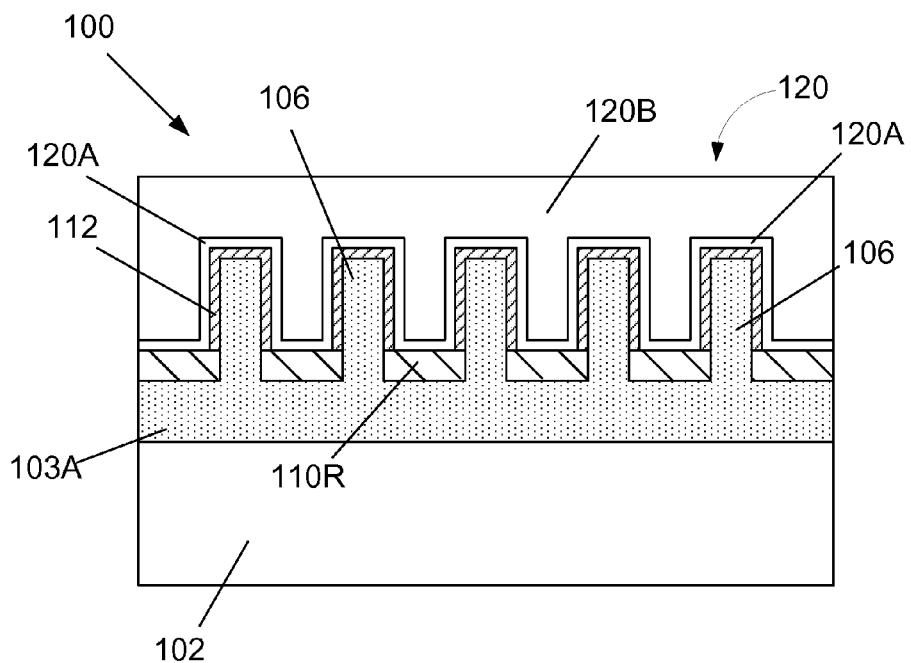

At the point of processing depicted in FIG. 3H, the illustrative FinFET device 100 may be completed using traditional fabrication techniques. For example, FIG. 3I depicts the device 100 after an illustrative gate structure 120 has been formed for the device 100. In one illustrative embodiment, the schematically depicted gate structure 120 includes an illustrative gate insulation layer 120A and an illustrative gate electrode 120B. The gate insulation layer 120A may be comprised of a variety of different materials, such as, for example, silicon dioxide, a so-called high-k (k greater than 10) insulation material (where k is the relative dielectric constant), etc. Similarly, the gate electrode 120B may also be of a material such as polysilicon or amorphous silicon, or it may be comprised of one or more metal layers that act as the gate electrode 120B. As will be recognized by those skilled in the art after a complete reading of the present application, the gate structure 120 of the device 100 depicted in the drawings, i.e., the gate insulation layer 120A and the gate electrode 120B, is intended to be representative in nature. That is, the gate structure 120 may be comprised of a variety of different materials and it may have a variety of configurations, and the gate structure 120 may be made using either the so-called "gate-first" or "replacement gate" techniques. In one illustrative embodiment, an oxidation process or a conformal deposition process may be performed to form a gate insulation layer 120A comprised of a material such as, for example, silicon dioxide, silicon nitride, hafnium oxide, a high-k (k value greater than 10) insulating material, etc., on the fins 106 (or the diffusion blocking layer when employed). Thereafter, the gate electrode material 120B and a gate capping layer of material (not shown) may be deposited above the device 100 and the layers may be patterned using known photolithographic and etching techniques and planarized by known CMP techniques. Thereafter, using traditional techniques, sidewall spacers (not shown) may be formed proximate the gate structure 120 by blanket-depositing a layer of spacer material and thereafter performing an anisotropic etching process to define the spacers.

Figure 4:
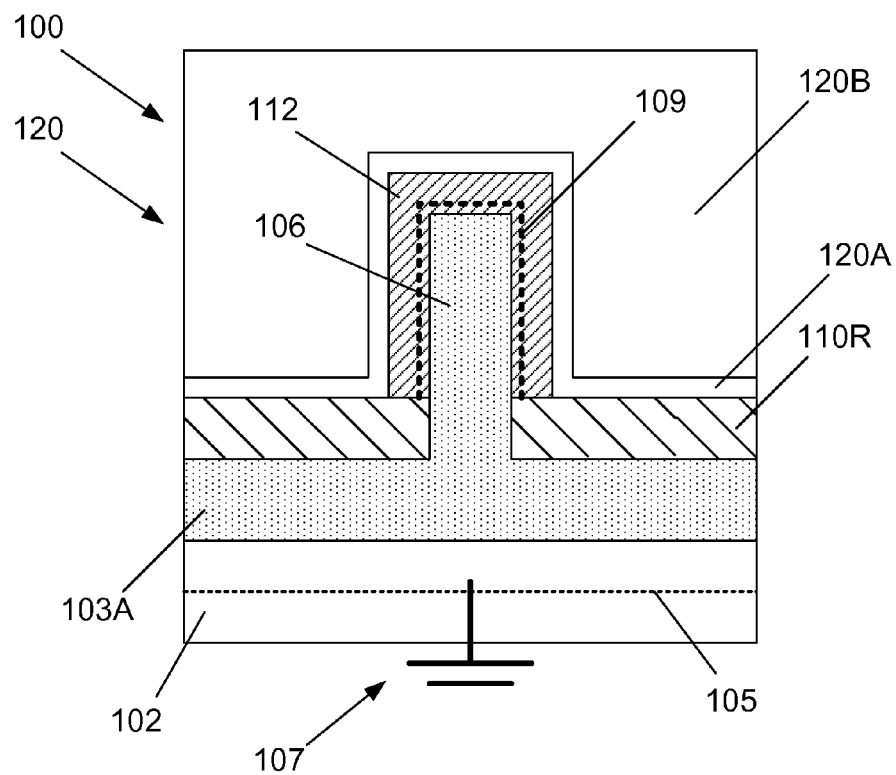
FIG. 4 is an enlarged view of one illustrative embodiment of a novel FinFET device that is comprised of alternative semiconductor materials that may be formed using the novel methods disclosed herein.

FIG. 4 is an enlarged, cross-sectional view of the channel region of one illustrative embodiment of a novel FinFET device 100 that is comprised of alternative semiconductor materials that may be formed using the novel methods disclosed herein. The optional diffusion blocking layer described above is depicted by the dashed line 109 in FIG. 4. Also depicted in FIG. 4 is a schematically depicted substrate contact 107 that is coupled to the well region 105 and the doped region 103A, such that an appropriate bias may be applied to the doped region 103A in the substrate fin 106. The illustrative substrate contact 107 may take any form or shape and it may terminate at the final backside of the substrate 102 (after packaging processes have been performed) or it may be formed through the front side 102S of the substrate 102. The substrate contact 107 may be used to bias the fin 106 such that a great deal, if not substantially all, of the current flows through the layer 112 of alternative semiconductor material during operation. For example, for a P-type FinFET device 100, a positive voltage may be applied to the doped region 103A in the fin 106 so as to cause substantially all of the holes to flow through the layer 112 of alternative semiconductor material during operation of the device. In the case where the layer 112 of alternative semiconductor material is comprised of silicon/germanium, this configuration may be particularly useful for P-type devices. Conversely, for an N-type FinFET device 100, a negative voltage may be applied to the doped region 103A in the fin 106 so as to cause substantially all of the electrons to flow through the layer 112 of alternative semiconductor material during operation of the device. In general, in one embodiment, the substrate fin 106 is at a potential that reverse biases the substrate fin 106 relative to the conducting fin 112.

Figure 5A:
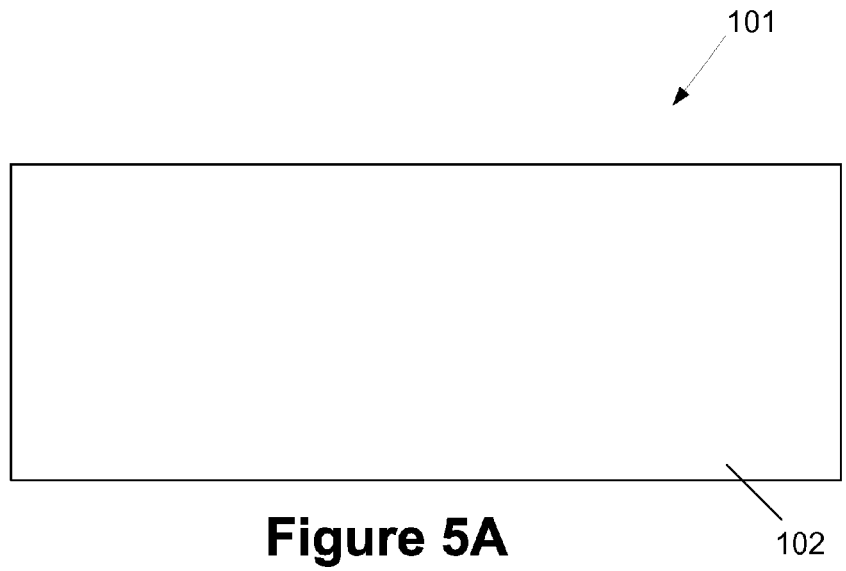
FIGS. 5A-5I depict yet another illustrative method disclosed herein for forming FinFET devices with alternative semiconductor channel materials.

FIGS. 5A-5I depict yet another illustrative method disclosed herein for an integrated circuit device 101 comprised of multiple FinFET devices with alternative semiconductor channel materials. Accordingly, as shown in FIG. 5A, this process flow begins with obtaining the above-described substrate 102.

Figure 5B:
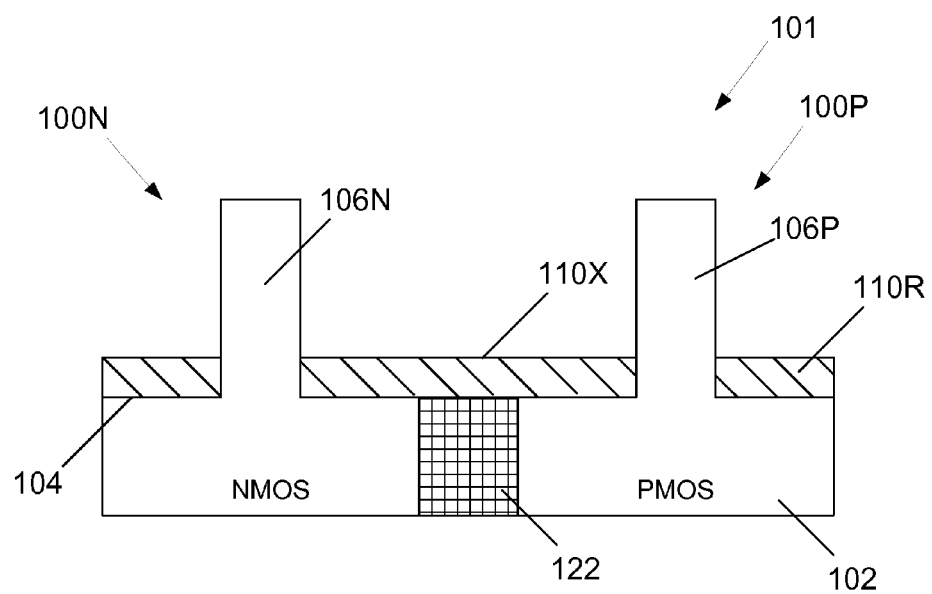

FIG. 5B depicts the integrated circuit device 101 after several process operations were performed. First, a schematically depicted isolation structure 122 was formed in the substrate 102 using traditional techniques. The isolation structure 122 defines an NMOS region in the substrate 102 where an illustrative N-type FinFET device 100N will be formed and a PMOS region where an illustrative P-type FinFET device 100P will be formed. Thereafter, an etching process, such as a dry or wet etching process, was performed on the substrate 102 through the patterned etch mask to form the above-described plurality of trenches 104 in the substrate 102. This etching process results in the definition of the above-described plurality of substrate fins 106, and, more specifically, an illustrative substrate fin 106N for the N-type FinFET device 100N and an illustrative substrate fin 106P for the P-type FinFET device 100P. Next, a plurality of process operations were performed to form the above-described recessed layer of insulating material 110R having a recessed upper surface 110X. As noted above, the recessed surface 110X of the recessed layer of insulating material 110R essentially defines the final active fin height of the fins 106N, 106P.

Figure 5C:
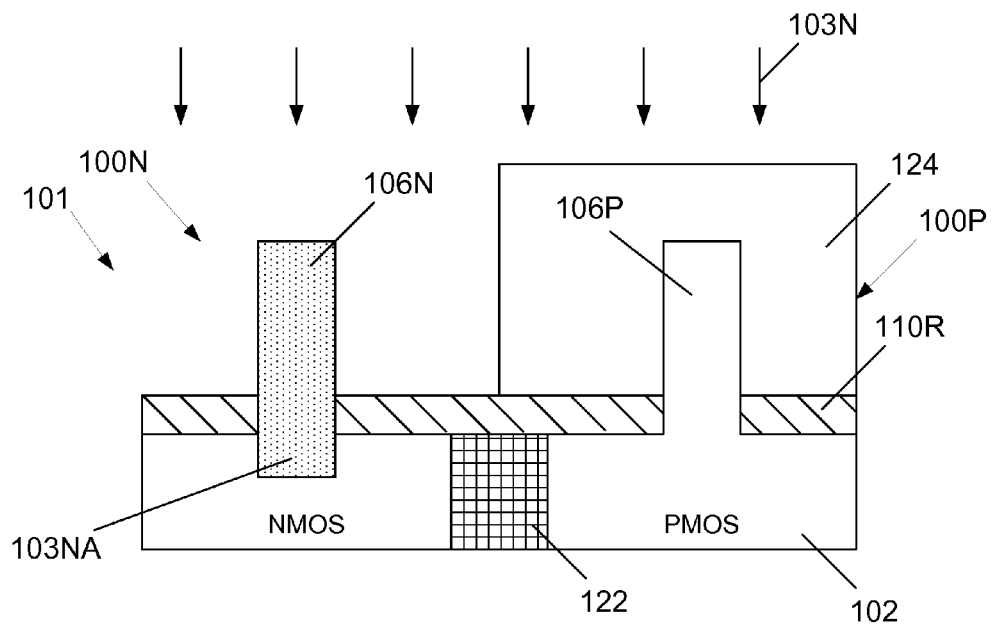

The next sequence of operations involves performing the above-described ion implantation process 103 that is specifically tailored for each of the devices 100N, 100P. The implantation processes may be performed in any order. In the example depicted herein, the implantation process is performed on the N-type FinFET device 100N first. Accordingly, FIG. 5C depicts the product 101 after a patterned masking layer 124 was formed above the product 101. The patterned masking layer 124 covers the PMOS region while leaving the NMOS region exposed for further processing. In one embodiment, the patterned masking layer 124 may be a patterned layer of photoresist material that may be formed using known photolithography tools and techniques or it may be a patterned hard mask layer, such as a layer of silicon nitride. Thereafter, an ion implantation process 103N, which is a version of the above-described implant process 103 that is specifically tailored for the N-type FinFET device 100N, was performed to form a doped region 103NA in the substrate 102 and the substrate fin 106N. The parameters of the implant process 103N will fall within those described above for the implant process 103. In this case, the implant process 103N will be performed using a P-type dopant material. The depth of penetration of the implant region 103NA as well as the targeted depth for the location of peak concentration of the implanted material will be the same as those described above with respect to the implant region 103A. As can be seen from the foregoing, the doped regions 103A, 103NA, 103PA formed as described above extend at least substantially throughout the entire vertical height and the lateral width of the fin 106 as well as into at least a portion of the substrate 102 positioned under the fin 106.

Figure 5D:
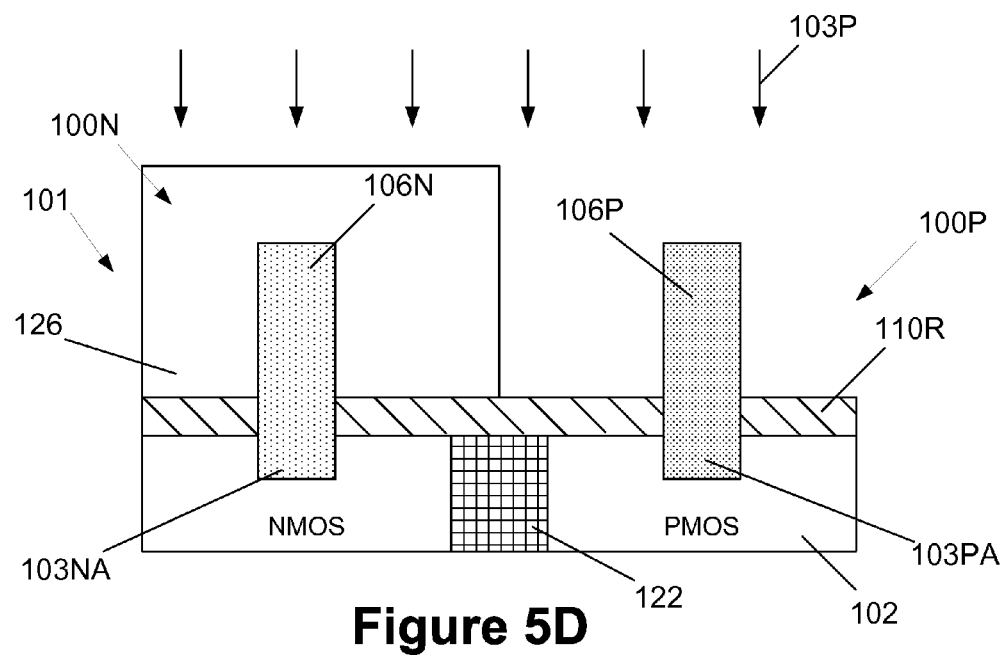

FIG. 5D depicts the product 101 after the patterned masking layer 124 was removed and after another patterned mask layer 126 was formed above the product 101. The patterned masking layer 126 covers the NMOS region while leaving the PMOS region exposed for further processing. In one embodiment, the patterned masking layer 126 may be a patterned layer of photoresist material that may be formed using known photolithography tools and techniques or it may be a patterned hard mask layer, such as a layer of silicon nitride. Thereafter, an ion implantation process 103P, which is a version of the above-described implant process 103 that is specifically tailored for the P-type FinFET device 100P, was performed to form a doped region 103PA in the substrate 102 and the substrate fin 106P. The parameters of the implant process 103P will fall within those described above for the implant process 103. In this case, the implant process 103P will be performed using an N-type dopant material. The depth of penetration of the implant region 103PA as well as the targeted depth for the location of peak concentration of the implanted material will be the same as those described above with respect to the implant region 103A.

Figure 5E:
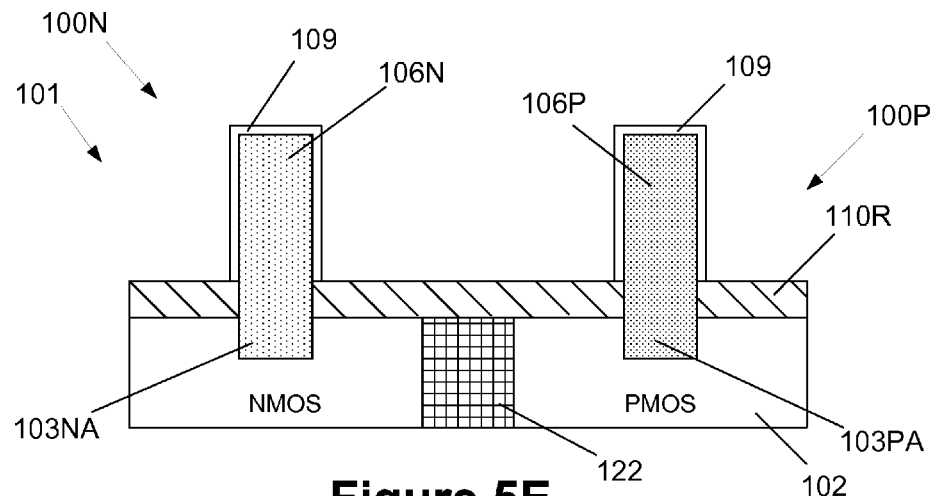

FIG. 5E depicts the product 101 after an epitaxial deposition process was performed to form the above-described diffusion blocking layer 109 (see FIG. 4) on the upper surface and the sidewall surfaces of the now-doped substrate fins 106N, 106P. As noted before, the diffusion blocking layer 109 may be optional in some applications.

Figure 5F:
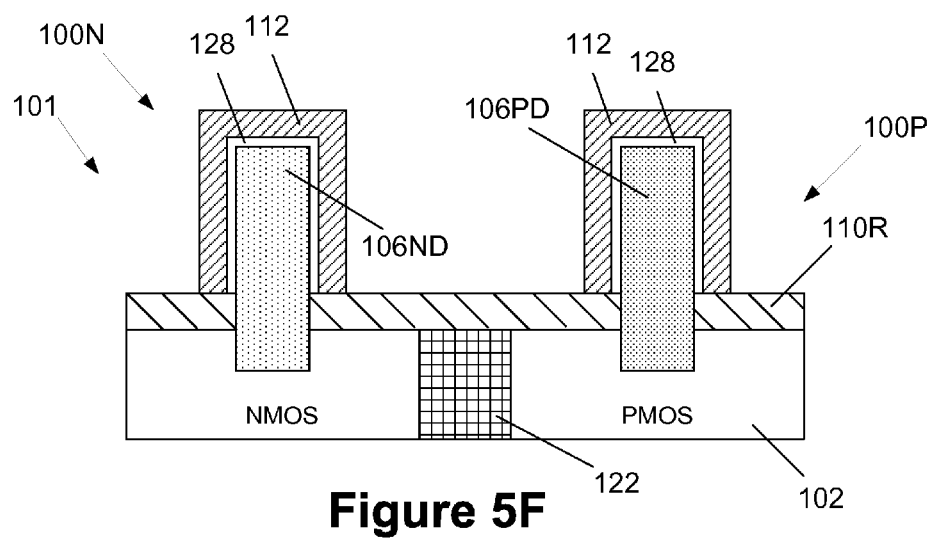

FIG. 5F depicts the product 101 after an epitaxial deposition process was performed to form the above-described layer 112 of alternative semiconductor material on the diffusion blocking layer 109 for both of the substrate fins 106N, 106P.

Figure 5G:
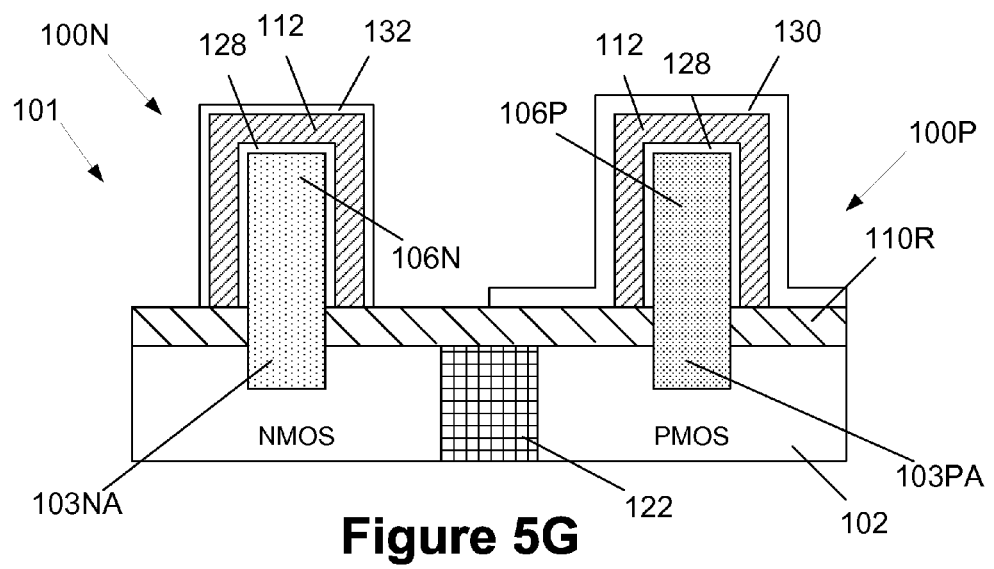

FIG. 5G depicts the product after several process operations were performed. First, a patterned hard mask layer 130 was formed so as to cover the P-type FinFET device 100P while leaving the N-type FinFET device 100N exposed for further processing. In one embodiment, the patterned hard mask layer 130 may be a patterned layer of silicon nitride. Thereafter, an epitaxial deposition process was performed to form another diffusion blocking layer 132 on the layer 112 of alternative semiconductor material positioned around the upper surface and the sidewall surfaces of the substrate fin 106N. The diffusion blocking layer 132 may be comprised of the same materials as those described above.

Figure 5H:
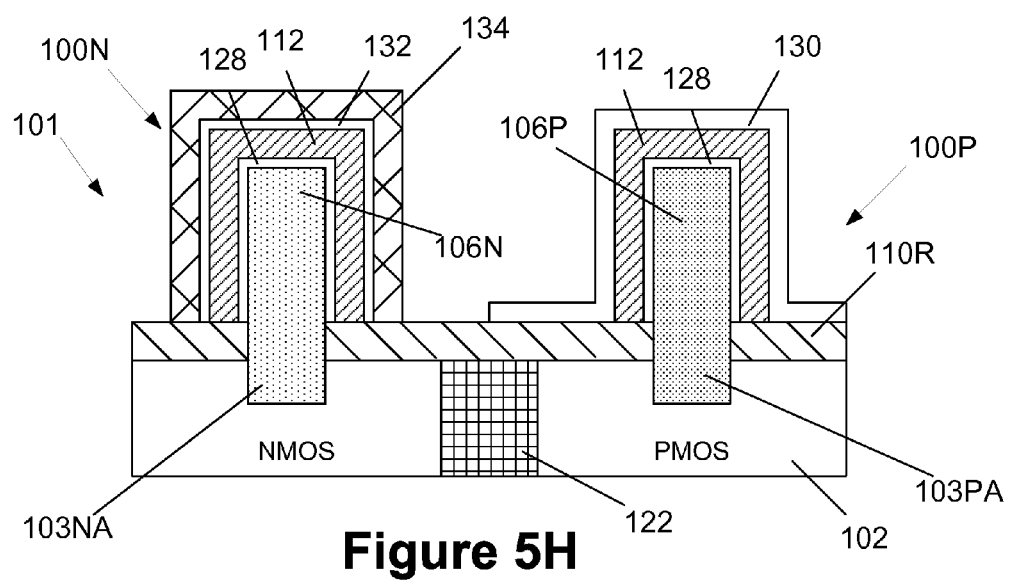

FIG. 5H depicts the product 101 after an epitaxial deposition process was performed to form a second layer 134 of an alternative semiconductor material on the diffusion blocking layer 132 positioned around the substrate fin 106N. The purpose of the diffusion blocking layer 132 is to prevent or limit out-diffusion of the dopant materials in the substrate fin 106N when the second layer 134 of alternative semiconductor material is being formed. The second layer 134 of alternative semiconductor material may be comprised of a variety of different semiconductor materials, e.g., silicon/germanium, silicon/carbon, one or more III-V materials, one or more II-VI materials, InP, InAs, GaAs, InGaAs, InSb, InGaSb, etc., or combinations thereof, and it may be either doped (in situ) or undoped and it may have a thickness of about 3-6 nm.

Figure 5I:
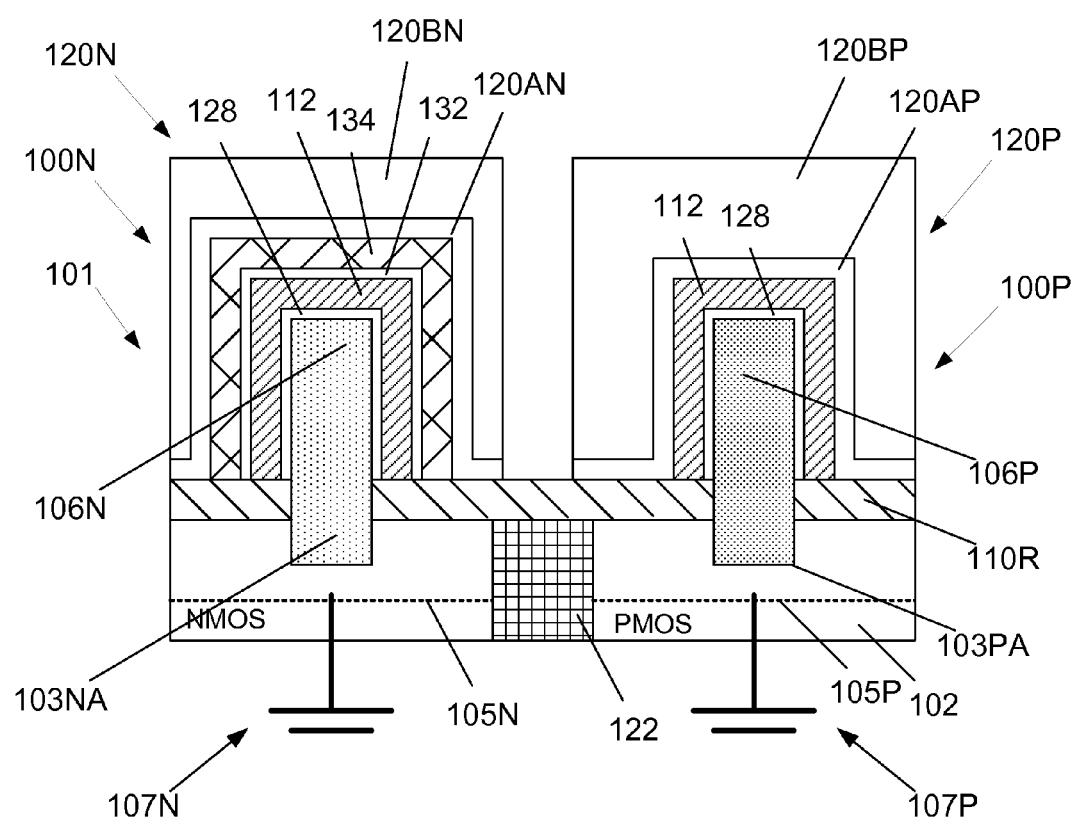

FIG. 5I depicts the product after several process operations were performed. First, the above-described patterned hard mask layer 130 was removed from above the P-type FinFET device 100P by performing an etching process. Thereafter, the above-described gate structure 120 was formed above each of the devices 100N, 100P. Of course, the materials of construction for each of the gate structures 120 for each of the devices 100N, 100P may be different, as is well understood by those skilled in the art. FIG. 5I also depicts the product 101 after schematically depicted substrate contacts 107N, 107P have been formed. The substrate contact 107N may be conductively coupled to the well region 105N and/or the doped region 103NA, such that an appropriate bias may be applied to the doped region 103NA in the substrate fin 106N. Similarly, the substrate contact 107P may be conductively coupled to the well region 105P and/or the doped region 103PA, such that an appropriate bias may be applied to the doped region 103PA in the substrate fin 106P. The illustrative substrate contacts 107N, 107P may take any form or shape and they may terminate at the final backside of the substrate 102 (after packaging processes have been performed) or they may be formed through the front side of the substrate 102.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a FinFET device in and above a substrate comprised of silicon, comprising:
    forming a doped fin for said device, said doped fin comprising a doped region that extends at least throughout a vertical height and a lateral width of said doped fin and at least into a portion of said substrate positioned vertically under said doped fin;
    forming a layer of germanium, silicon/germanium ($Si_xGe_{1-x}$) or a III-V semiconductor material around at least a portion of said doped fin; and
    forming a gate structure around at least a portion of said layer of germanium, silicon/germanium or III-V semiconductor material above said portion of said doped fin to define a channel region of said FinFET device in said portion of said layer of germanium, silicon/germanium or III-V semiconductor material, wherein said gate structure includes a gate insulation layer formed above said layer of germanium, silicon/germanium or III-V semiconductor material and a gate electrode formed above said gate insulation layer.

2. The method of claim 1, wherein said layer of germanium, silicon/germanium or III-V semiconductor material is formed on and in contact with said portion of said doped fin.

3. The method of claim 1, further comprising, prior to forming said layer of germanium, silicon/germanium or III-V semiconductor material, forming a diffusion blocking layer on said portion on said doped fin and thereafter forming said layer of germanium, silicon/germanium or III-V semiconductor material on and in contact with said diffusion blocking layer.

4. The method of claim 1, further comprising:
    forming a diffusion blocking layer on said layer germanium, silicon/germanium or III-V semiconductor material; and
    forming a layer of an alternative semiconductor material on and in contact with said diffusion blocking layer, wherein said alternative semiconductor material is comprised of one of silicon/germanium, silicon/carbon, a III-V material, a II-VI materials, InP, InAs, GaAs, InGaAs, InSb, InGaSb, or combinations thereof.

5. The method of claim 1, wherein forming said doped region in said doped fin of said device comprises:
    performing an ion implantation process to form a doped substrate region in said substrate; and
    after performing said ion implantation process, performing at least one etching process through a patterned etch mask layer to define a plurality of spaced-apart trenches in said substrate that define said doped fin comprised of said doped region.

6. The method of claim 1, wherein forming said doped region in said doped fin of said device comprises:
    performing at least one etching process through a patterned etch mask layer to define a plurality of spaced-apart trenches in said substrate that define a substrate fin in said substrate; and
    after forming said substrate fin, performing an ion implantation process to implant ions into at least said substrate fin and thereby form said doped fin comprised of said doped region.

7. The method of claim 1, wherein said doped region has a dopant concentration of at least $1\text{-}3\times10^{18}$ ions/cm$^3$ of a P-type dopant or an N-type dopant.

8. The method of claim 1, wherein said FinFET device is an N-type FinFET device and wherein said doped region is comprised of a P-type dopant material.

9. The method of claim 1, wherein said FinFET device is a P-type FinFET device and wherein said doped region is comprised of an N-type dopant material.

10. The method of claim 1, wherein said gate structure is one of a final gate structure or a sacrificial gate structure for said FinFET device.

11. The method of claim 1, wherein, prior to forming said layer of germanium, silicon/germanium ($Si_xGe_{1-x}$) or a III-V semiconductor material around at least a portion of said doped fin, forming a diffusion blocking layer on said fin and thereafter forming said layer of germanium, silicon/germanium ($Si_xGe_{1-x}$) or a III-V semiconductor material on said diffusion blocking layer around at least a portion of said doped fin.

12. The method of claim 1, wherein forming said layer of germanium, silicon/germanium ($Si_xGe_{1-x}$) or a III-V semiconductor material around at least a portion of said doped fin comprises forming said layer of germanium, silicon/germanium ($Si_xGe_{1-x}$) or a III-V semiconductor material around at least a portion of said doped fin and on and in contact with said doped fin.

13. A method of forming a FinFET device in and above a substrate comprised of silicon, comprising:
    forming a doped fin for said device, said doped fin comprising a doped region that extends at least throughout a vertical height and a lateral width of said doped fin and at least into a portion of said substrate positioned vertically under said doped fin and wherein said doped region has a dopant concentration of at least $1-3\times10^{18}$ ions/cm³ of a P-type dopant or an N-type dopant;
    forming a diffusion blocking layer on and in contact with at least a portion of said doped fin,
    forming a layer of germanium, silicon/germanium or III-V semiconductor material on and in contact with said diffusion blocking layer; and
    forming a gate structure around at least a portion of said layer of germanium, silicon/germanium or III-V semiconductor material above said portion of said doped fin to define a channel region of said FinFET device in said portion of said layer of germanium, silicon/germanium or III-V semiconductor material, wherein said gate structure includes a gate insulation layer formed above said layer of germanium, silicon/germanium or III-V semiconductor material and a gate electrode formed above said gate insulation layer.

14. The method of claim 13, wherein forming said doped region in said doped fin of said device comprises:
    performing an ion implantation process to form a doped substrate region in said substrate; and
    after performing said ion implantation process, performing at least one etching process through a patterned etch mask layer to define a plurality of spaced-apart trenches in said substrate that define said doped fin comprised of said doped region.

15. The method of claim 13, wherein forming said doped region in said doped fin of said device comprises:
    performing at least one etching process through a patterned etch mask layer to define a plurality of spaced-apart trenches in said substrate that define a substrate fin in said substrate; and
    after forming said substrate fin, performing an ion implantation process to implant ions into at least said substrate fin and thereby form said doped fin comprised of said doped region.

16. A FinFET device formed in and above a substrate comprised of silicon, comprising:
    a fin comprised of silicon, said fin comprising an upper surface and a plurality of sidewall surfaces;
    a doped region that extends at least throughout a vertical height and a lateral width of said fin and at least into a portion of said substrate that is positioned vertically under said fin;
    a layer of germanium, silicon/germanium or III-V semiconductor material positioned around said upper surface and said sidewall surfaces of said fin; and
    a gate structure positioned around said layer of germanium, silicon/germanium or III-V semiconductor material above said doped region, wherein a channel region of said FinFET device is defined in said layer of germanium, silicon/germanium or III-V semiconductor material, and said gate structure includes a gate insulation layer formed above said layer of germanium, silicon/germanium or III-V semiconductor material and a gate electrode formed above said gate insulation layer.

17. The device of claim 16, wherein said layer of germanium, silicon/germanium or III-V semiconductor material is positioned on and in contact with said upper surface and said sidewall surfaces of said fin.

18. The device of claim 16, further comprising a diffusion blocking layer positioned between said upper surface and said sidewall surfaces of said fin and said layer of germanium, silicon/germanium or III-V semiconductor material.

19. The device of claim 18, wherein said layer of germanium, silicon/germanium or III-V semiconductor material is positioned on and in contact with said diffusion blocking layer.

20. The device of claim 16, wherein said doped region has a dopant concentration of at least $1-3\times10^{18}$ ions/cm³ of a P-type dopant or an N-type dopant.

* * * * *